United States Patent
Goerdeler et al.

(10) Patent No.: US 12,021,210 B2
(45) Date of Patent: Jun. 25, 2024

(54) BRAZED BATTERY COOLING PLATES

(71) Applicant: Mahle International GmbH, Stuttgart (DE)

(72) Inventors: Matthias Goerdeler, Stuttgart (DE); Cord Voelker, Backnang (DE)

(73) Assignee: Mahle International GmbH (DE)

( * ) Notice: Subject to any disclaimer, the term of this patent is extended or adjusted under 35 U.S.C. 154(b) by 0 days.

(21) Appl. No.: 17/329,146

(22) Filed: May 25, 2021

(65) Prior Publication Data

US 2021/0367289 A1    Nov. 25, 2021

(30) Foreign Application Priority Data

May 25, 2020    (DE) .......................... 102020206441.5

(51) Int. Cl.
| | |
|---|---|
| H01M 10/6556 | (2014.01) |
| H01M 10/613 | (2014.01) |
| H01M 10/625 | (2014.01) |
| H05K 7/20 | (2006.01) |

(52) U.S. Cl.
CPC ..... *H01M 10/6556* (2015.04); *H01M 10/613* (2015.04); *H01M 10/625* (2015.04); *H05K 7/20254* (2013.01); *H01M 2220/20* (2013.01)

(58) Field of Classification Search
CPC .......... H01M 10/6556; H01M 10/613; H01M 10/625; H01M 10/6554; H05K 7/20254; Y02E 60/10; B23P 15/26
USPC ...................................................... 165/80.2
See application file for complete search history.

(56) References Cited

U.S. PATENT DOCUMENTS

| | | | | |
|---|---|---|---|---|
| 2,662,273 A | * | 12/1953 | Long ......................... | F28F 3/14 165/170 |
| 2,673,542 A | * | 3/1954 | Smith .................. | B21D 53/045 29/890.053 |
| 2,690,002 A | | 9/1954 | Grenell | |
| 2,779,086 A | * | 1/1957 | Rieppel ................ | B21D 53/045 428/650 |
| 3,018,543 A | * | 1/1962 | Beck ......................... | F28F 3/14 228/173.6 |
| 3,034,204 A | * | 5/1962 | Grenell ...................... | F28F 3/14 29/890.047 |

(Continued)

FOREIGN PATENT DOCUMENTS

| | | |
|---|---|---|
| CN | 1926398 A | 3/2007 |
| CN | 101839665 A | 9/2010 |

(Continued)

OTHER PUBLICATIONS

English abstract for DE-1020110808528.

(Continued)

*Primary Examiner* — Len Tran
*Assistant Examiner* — Gustavo A Hincapie Serna
(74) *Attorney, Agent, or Firm* — Fishman Stewart PLLC

(57) ABSTRACT

A method for producing a multi-part cooling plate may including joining a flat component and a channel component. The flat component and the channel component may be formed from aluminum. The method may include forming a coolant conducting channel structure. Following the joining of the flat component with the channel component, the cooling plate may be cold worked, which may increase the strength and the flatness of the cooling plate.

20 Claims, 1 Drawing Sheet

(56) References Cited

U.S. PATENT DOCUMENTS

| | | | | |
|---|---|---|---|---|
| 3,141,998 A * | 7/1964 | Silkman | ............. | H05K 7/20636 |
| | | | | 174/15.1 |
| 3,271,846 A * | 9/1966 | Buechele | ................ | F28F 3/027 |
| | | | | 428/654 |
| 3,322,190 A * | 5/1967 | Johnson, Jr. | ............ | F28D 1/047 |
| | | | | 165/170 |
| 3,340,589 A * | 9/1967 | Jaeger | ................. | B21D 53/045 |
| | | | | 165/172 |
| 3,349,469 A * | 10/1967 | Muije | ................. | B21D 53/045 |
| | | | | 228/205 |
| 3,421,577 A * | 1/1969 | Valyi | .................... | B21D 53/045 |
| | | | | 165/170 |
| 3,458,917 A * | 8/1969 | Mueller | ............... | B21D 53/045 |
| | | | | 29/890.042 |
| 3,728,778 A * | 4/1973 | Middleton | ........... | B21D 53/045 |
| | | | | 228/191 |
| 4,179,781 A * | 12/1979 | Long | ...................... | B21D 53/04 |
| | | | | 29/890.039 |
| 4,700,445 A * | 10/1987 | Raskin | ...................... | F28F 3/14 |
| | | | | 29/890.039 |
| 4,805,693 A * | 2/1989 | Flessate | ................. | F28F 3/025 |
| | | | | 165/DIG. 464 |
| 5,249,359 A * | 10/1993 | Schubert | ............. | B01D 25/001 |
| | | | | 29/17.2 |
| 5,465,785 A * | 11/1995 | Adderley | .............. | F28D 9/0031 |
| | | | | 165/170 |
| 9,766,015 B2 * | 9/2017 | Matsuura | .................. | F28F 9/02 |
| 11,766,708 B2 | 9/2023 | Holzhauer | | |
| 2004/0261986 A1 * | 12/2004 | Insalaco | .................... | F28F 1/16 |
| | | | | 165/181 |
| 2006/0096740 A1 * | 5/2006 | Zheng | ................ | F28D 15/0233 |
| | | | | 165/104.33 |
| 2008/0239671 A1 * | 10/2008 | Amano | ............... | H01L 23/3735 |
| | | | | 257/E23.098 |
| 2013/0306284 A1 | 11/2013 | Molnar | | |
| 2015/0086831 A1 * | 3/2015 | Haussmann | ........ | H01M 10/625 |
| | | | | 429/120 |
| 2016/0043454 A1 * | 2/2016 | Shaaia | ...................... | F28F 3/12 |
| | | | | 29/890.035 |
| 2016/0056088 A1 * | 2/2016 | Uhlemann | .......... | H01L 23/4924 |
| | | | | 257/692 |
| 2016/0237537 A1 * | 8/2016 | Pham | ...................... | C22C 45/10 |
| 2018/0062226 A1 * | 3/2018 | Raiser | ................. | H01M 10/613 |
| 2019/0239391 A1 * | 8/2019 | Hsiao | ................. | H05K 7/20336 |
| 2020/0343564 A1 * | 10/2020 | Berner | .................. | B21D 13/00 |
| 2021/0083343 A1 * | 3/2021 | West | .................... | H01M 50/227 |
| 2021/0121933 A1 * | 4/2021 | Go | ....................... | H01M 50/578 |
| 2021/0247145 A1 * | 8/2021 | Vakilimoghaddam | ...................... | |
| | | | | F28D 1/0341 |
| 2022/0097121 A1 * | 3/2022 | Colugnati | ............ | B21D 53/045 |
| 2022/0344739 A1 * | 10/2022 | Ishitobi | ................. | H01M 50/20 |
| 2022/0380628 A1 * | 12/2022 | Lin | .......................... | B32B 37/12 |

FOREIGN PATENT DOCUMENTS

| | | |
|---|---|---|
| CN | 203071191 U | 7/2013 |
| CN | 103348193 A | 10/2013 |
| CN | 210272607 U | 4/2020 |
| CN | 111132774 A | 5/2020 |
| DE | 1020110808528 | 2/2013 |
| DE | 102018216047 A1 | 3/2020 |

OTHER PUBLICATIONS

Chinese Office Action dated Dec. 25, 2023 and Chinese Search Report dated Dec. 20, 2023 for Chinese Patent Application No. 202110563134.4.

\* cited by examiner

BRAZED BATTERY COOLING PLATES

CROSS-REFERENCE TO RELATED APPLICATION

This application claims priority to German Application No. DE 10 2020 206 441.5 filed on May 25, 2020, the contents of which are hereby incorporated by reference in its entirety.

This application claims priority to German Application No. DE 10 2020 206 441.5 filed on May 25, 2020, the contents of which are hereby incorporated by reference in its entirety.

TECHNICAL FIELD

The present invention relates to a method for producing a multi-part cooling plate, having a flat component and a channel component, according to the preamble of claim 1. In addition, the invention relates to a heat exchanger having a cooling plate produced according to this method.

BACKGROUND

A cooling of batteries for electric vehicles is generally effected via cooling plates made of metal, in particular of aluminium, which are directly joined to the battery over a large surface area by way of a heat-conducting bond. Depending on the design, the cooling plates can have a surface area of approximately 0.25 $m^2$ to 4 $m^2$, but depending on requirement, can obviously also be larger or smaller. The known cooling plates usually have a channel structure in which a coolant for cooling the cooling plates, and thus also for cooling the battery, flows. Obviously, a heating or generally a temperature-controlling of the battery can also take place via such cooling plates through hot coolant.

For producing such cooling plates, these are usually constructed in multiple layers, namely of a preferentially flat component and a channel component, which comprises for example grooves. On joining the two components, i.e. when for example soldering the two components to one another, the channel component comprising the grooves and the flat component covering these grooves form the cooling channel structure, wherein a heat transfer usually takes place by way of a flat contact of the flat component against the battery to be cooled. Connecting the two components is usually effected by soldering, which can take place for example in a continuous oven but also by way of an inductive heating or a radiation heating or contact heating, etc.

Disadvantageous with such cooling plates however is that the flatness of the components, in particular of the flat component, can be ensured in a soldering oven with intense heating and subsequent intense cooling only with difficulty, as a result of which a contact over the full surface area with the battery to be cooled and thus a high cooling performance are impaired. In addition, the strength of the aluminium is also significantly reduced which is due to the thermal treatment. By way of the soldering and thus intense heating of the aluminium components the strength and hardness of these are substantially reduced.

By way of the disadvantages described before, elaborate and thus also expensive soldering devices have to be designed for achieving an adequate flatness, in particular of the flat component of the cooling plate. Because of the low strength of the aluminium after the soldering a greater material thickness of the components is additionally required in order to be able to ensure customer requirements in terms of pressure stability. A further disadvantage of cooling plates that are produced in this manner and are comparatively soft is that they are extremely flexible as a result of which the handling in a production has to be likewise performed extremely carefully in order to be able to reliably exclude an undesirable, subsequent deformation.

SUMMARY

The present invention therefore deals with the problem of stating an improved or at least an alternative embodiment for a method of the generic type, which in particular overcomes the disadvantages know from the prior art.

According to the invention this problem is solved through the subject of the independent claim 1. Advantageous embodiments are subject of the dependent claims.

The present invention is based on the general idea of improving a method known to date for producing cooling plates made of aluminium for heat exchangers, for example for electric vehicles, so that the cooling plate following a joining of its individual components is once more cold-worked, for example stretched, as a result of which in particular for example the flatness lost by a soldering process and the strength that is likewise reduced through a soldering process can be significantly increased. With the method according to the invention for producing a multi-part cooling plate having a flat component and a channel component, the flat component and the channel component are joined to one another and, in a state joined to one another, form a coolant-conducting channel structure. The flat component and the channel component are made of aluminium, wherein the channel component can comprise for example a groove structure which, in the state joined to the flat component, is covered by the flat component as a result of which the cooling channel is created. According to the invention, this cooling plate, following the joining of the flat component with the channel component, is now cold-worked, as a result of which both the strength and also the flatness can be increased. By increasing the flatness, a contact to a flat outer surface of a battery over a full surface area can be ensured, as a result of which a high heat transfer and because of this a high temperature-control performance or cooling performance are possible. Through the increased strength, the multi-part cooling plate produced according to the invention is less sensitive during the further production or assembly, as a result of which special handling equipment in particular, which prevented a subsequent deformation feared in the past, can be omitted. Here, by working and eliminating unevennesses performed simultaneously it is additionally possible to more rapidly cool the cooling plate following a cooling process, as a result of which the potential of the usable aluminium alloys for hardening can be increased. The increased strength in turn has the consequence that the thickness of the flat component or of the channel component for the cooling plate can be correspondingly reduced, as a result of which a weight, resources and cost saving can be achieved.

In an advantageous further development of the solution according to the invention, the cooling plate, following the joining of the flat component with the channel component, is stretched by approximately 0.1 to 10%, preferentially by approximately 1 to 3%, i.e. elongated. By stretching or elongating, distortions or corrugations in the cooling plates, in particular in the flat component of the cooling plate following the joining, for example following the soldering or welding, can be eliminated. Upon an elongation between 1 and approximately 3%, an adequate flatness of the cooling plate or its first component is already achieved, wherein depending on the waviness of the cooling plate or of its first component, lesser degrees of working below 1% can also be adequate. A further substantial advantage of the cold stretching is that depending on the degree of working used during the cold stretching, the material strength increases, i.e. the very soft and flexible cooling plates, because of the partly large design, can be improved with respect to strength and thickness. Upon a stretching of the cooling plate between 1 and 10%, a strength increase of up to 100% can occur depending on the aluminium alloy used.

In an advantageous further development of the solution according to the invention, the cooling plate, following the joining of the flat component with the channel component, defines an x-y plane and is stretched in the x-direction and/or in the y-direction, i.e. elongated. A stretching perpendicularly to the plane of the cooling plate is not usually provided since this would strain and in an unfavourable case even damage the joint between the flat component and the channel component of the cooling plate.

Besides the actual elongating, i.e. stretching of the cooling plate, further cold-working methods can obviously also be used in addition or alternatively, wherein "cold" is to merely mean the working below the recrystallization temperature of aluminium. Through the described cold-working methods, a work hardening and thus also an increase of the material strength occur. Further cold-working methods can be for example bending, drawing, hammering or even shot peening and by way of a hydraulic internal pressure, a high-pressure internal working. With all cold-working methods described only exemplary here, dislocations and internal stresses occur in the cold-worked material, which besides the increase of the hardness and the yield limit, can also result in changed other properties, for example electrical and magnetic properties. By way of the cold-working, not only can the flatness and the strength be increased, but, because of the increased strength, the further processing of the cooling plate significantly simplified since the same is no longer as soft and thus sturdier.

In a further advantageous embodiment of the solution according to the invention, the flat component and the channel component are soldered or welded to one another. For producing such cooling plates, the individual components of the cooling plate are usually soldered to one another, for example in a soldering oven, which results in a reduction of the strength of the aluminium and can result in a waviness, i.e. a certain unevenness at the same time. Obviously, a similar effect also occurs during the welding. Through the subsequent cold-working, both the flatness and also the strength can be increased again, wherein obviously further methods steps are also conceivable, for example a heat after-treatment, for example tempering of the aluminium after the cold-working in order to re-introduce a certain ductility into the material. Through the increased strength gained through the cold-working, the lifespan of such cooling plates and thus also the lifespan of heat exchangers having such a cooling plate can be increased.

Practically, the cooling plate, following the soldering or the welding of the flat component to the channel component and prior to the cold-working, is cooled down with a cooling rate of >15K/min, in particular of >40K/min, in the temperature range 570-200° C. Through the faster cooling down, an improved hardening of the aluminium alloy and thus a higher strength of the same can also be achieved. For a subsequent cold or warm hardening of precipitation-hardenable aluminium alloys, cooling rates in the temperature range between 570-200° C., should be at least 15K/min, in particular 40K/min. Cooling gradients of approximately 100K/min are better, as a result of which optimal prerequisites for a subsequent cold or warm hardening are created and the strength increase through stretching is optimised. While a higher cooling rate causes a greater distortion of the cooling plates, but which, as already described, can be rectified by the stretching.

In another advantageous development of the solution according to the invention, the flat component and/or the channel component has a thickness d, of 0.2 mm<d<2.0 mm, in particular a thickness d of 0.2 mm<d<1.5 mm. In order to be able to achieve the same strength of the cooling plate, for example in terms of the pressure stability, it is possible because of the strength increased through the cold-working, to reduce the wall thicknesses of the cooling plate, i.e. of its flat component or channel component, for example by 20-50%, as a result of which a considerable resource, cost and weight advantage can be achieved.

The present invention is based, furthermore, on the general idea of equipping a heat exchanger with a cooling plate produced according to the method described in the preceding paragraphs. By way of this the advantages of the cooling plate with respect to better heat transferability and higher strength and, if appropriate, lower weight, can be transferred to the heat exchanger, as a result of which the same, for example when used in electric vehicles, produces a higher cooling performance and additionally, because of the lower weight, requires less electric energy while driving.

Further important features and advantages of the invention are obtained from the sub claims, from the drawings and from the associated figure description by way of the drawings.

It is to be understood that the features mentioned above and still to be explained in the following cannot only be used in the respective combinations stated but also in other combinations or by themselves without leaving the scope of the present invention.

Preferred exemplary embodiments of the invention are shown in the drawings and are explained in more detail in the following description, wherein same reference numbers relate to same or similar or functionally same components.

BRIEF DESCRIPTION OF THE DRAWINGS

It shows, in each case schematically.

DETAILED DESCRIPTION

Figure 1:
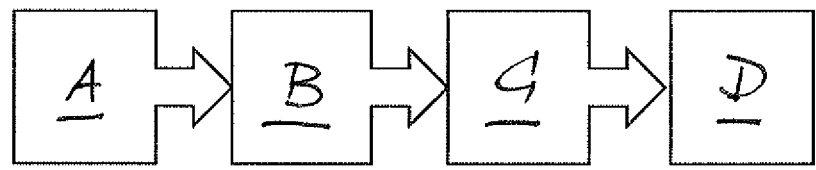
FIG. 1 a possible sequence of a method according to the invention for producing a multi-part cooling plate, FIG. 2 a view of a cooling plate according to the invention produced according to the method according to the invention, FIG. 3 a sectorial representation through a cooling plate produced according to the invention.

In a method according to the invention for producing a multi-part cooling plate 1 (see also FIGS. 2 and 3) according to FIG. 1, a flat component 2 and a channel component 3 are initially provided This can take place for example in the method step A. Following this, the flat component 2 and the channel component 3, which are both formed from aluminium, are joined to one another, for example via a soldered connection, and in a state connected to one another form a coolant-conducting channel structure 4 (see FIG. 3). This can take place for example in the method step B. Following the establishment of a connection 5, for example of a soldered connection 6, the cooling plate 1 is cold-worked in the method step C, as a result of which the cooling plate 1 and also its flatness, in particular the flatness of the component 2, had been increased. Following the cold-working, the cooling plate 1 is completed in the method step D.

With the cold-working of the cooling plate 1, according to the invention following the establishment of the connection 5, in particular following the establishment of the soldered connection 6 or a welded connection 7, a deformation or waviness, in particular of the flat component 2, developing during the hot-joining of the flat component 2 to the channel component 3 can be reversed, as a result of which the cooling plate 1, following the cold-working, has a preferentially completely flat component 2. By way of such a flat component 2, a large area contact for example with a battery 9 placed thereon can be achieved, as a result of which a high heat transfer area and thus also a high cooling performance can be achieved.

Through the cold-working in the method step C, the strength of the aluminium can be additionally increased significantly, as a result of which the cooling plate 1 is sturdier and need no longer be handled as carefully in a further production or assembly step. In particular, special handling equipment required to date, which in the past gripped the cooling plates that were comparatively soft, so sensitively that these did not get deformed, is avoided. Because of the higher strength through the cold-working, an increased pressure stability can be achieved, as a result of which the use of thinner wall thicknesses, both in the flat component 2 and also in the channel component 3 is possible. Because of this, resources, costs and weight can be saved.

The cold-working can take place for example by a stretching, so that the cooling plate 1 following the joining of the flat component 2 with the channel component 3 is stretched, i.e. elongated approximately 0.1% to 10%. Here, an elongation preferentially amounts to approximately 1% to 3%.

Figure 2:
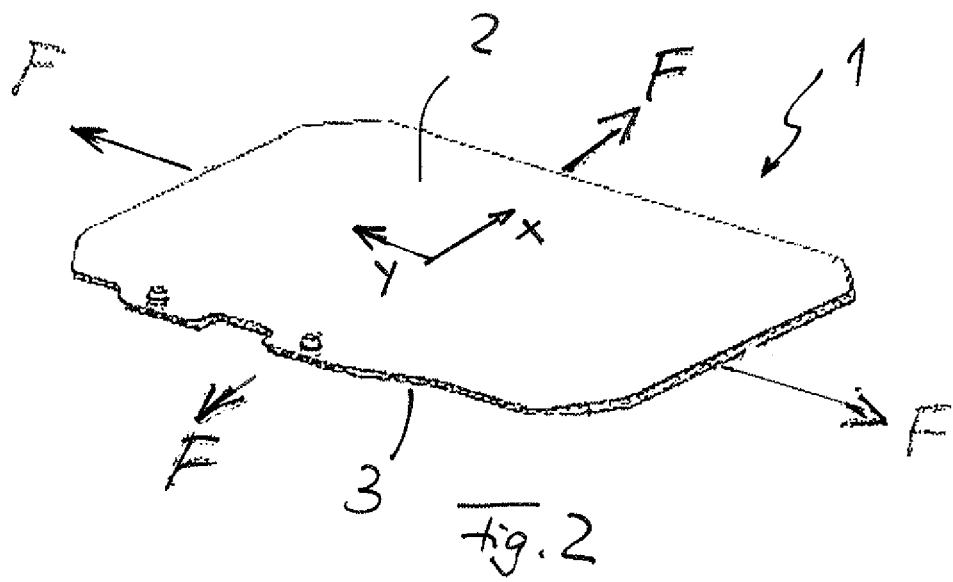

According to FIG. 2 such a stretching process is shown, wherein in this case corresponding forces F act on all four sides or margins of the cooling plate 1 and cause the stretching of the cooling plate 1 and thus the increase of the strength and the reduction of the waviness of the same.

Figure 3:
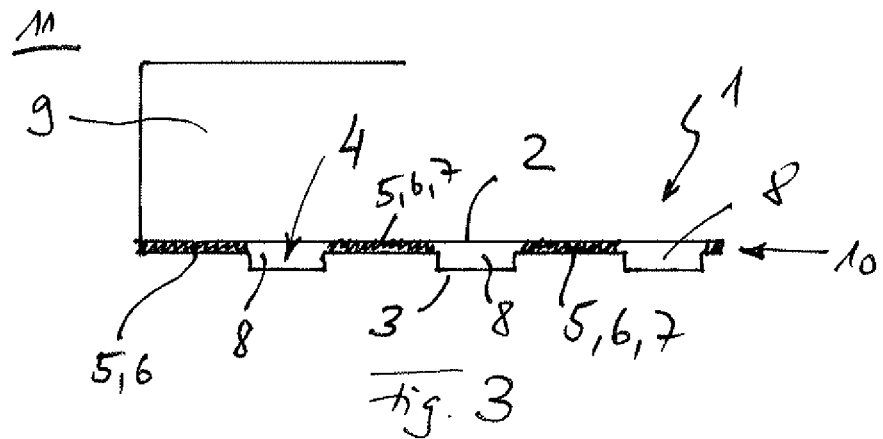

Viewing FIGS. 2 and 3 further it is noticeable that the cooling plate 1, following the joining of the flat component 2 with the channel component 3, defines an x-y plane and a stretching takes place in the x-direction and/or y-direction. Stretching transversely to the plane is not provided.

Viewing FIG. 3, a cross section through the cooling plate 1 according to the invention is noticeable there, wherein the flat component 2 is arranged at the top and the channel component 3 at the bottom. In contact regions between the flat component 2 and the channel component 3, the connection 5, for example the soldered connection 6 or the welded connection 7 are arranged, so that between individual connections 5, channels 8 of the channel structure 4 are created. Through these channels 8, coolant can flow as a result of which the cooling plate 1 is cooled and this cooling is transferred to a battery 9 for example placed flat on the flat component 2 of the cooling plate 1. By way of the reduced waviness of the flat component 2, a preferentially full surface-area contact and thus an optimised heat transfer are possible between the said component and a bottom of the battery 9.

A cold-working of the cooling plate 1 after establishing the connection 5, in particular the soldered connection 6, between the flat component 2 and the channel component 3, can take place additionally or alternatively to the stretching also by way of a hammering, rolling or stamping and by way of a hydraulic internal pressure using a high-pressure internal working. The only important part here is the transformation of the crystal structure increasing the strength of the cooling plate 1.

After the soldering or welding of the flat component 2 to the channel component 3 and still prior to the cold working, i.e. for example prior to the stretching, the cooling plate 1 is practically cooled down with a cooling rate of at least 15K/min, in particular of at least 40K/min, in the temperature range 570-200° C. Through the subsequent cold-working, the cooling plate can be more rapidly cooled down after the establishment of the soldered connection C, as a result of which an improved hardening and thus likewise a strength increase can be achieved. Through the increased strength, it is not only the lifespan of the cooling plate 1 that can be increased, but a thickness of the flat component 2 and/or of the channel component 3 can also be reduced with the same required strength, so that compared with previous cooling plates a reduction of the wall thickness by 20-50% is possible. During the cold-working, for example during the stretching, a strength increase, depending on the aluminium alloy, of up to 100% can occur so that in this case a reduction of the wall thickness by 50% would be conceivable. Obviously, the connection 5 can purely theoretically also be established as a bonded connection, wherein in this case the strength-increasing effect through the subsequent cold-working is reduced.

With the method according to the invention, a cooling plate, for example for a heat exchanger 10 of an electric vehicle 11, can thus be created, which can be produced faster, with lower weight with same strength or higher strength with same weight and improved heat transfer because of the reduced unevenness.

The invention claimed is:

1. A method for producing a multi-part cooling plate comprising:
    providing a channel component with a groove structure;
    joining a flat component with the channel component such that the groove structure is covered by the flat component to form a coolant conducting channel structure;
    wherein following the joining of the flat component with the channel component, cold working the cooling plate to increase the strength and the flatness of the cooling plate;
    wherein the flat component and the channel component are formed from aluminium;
    wherein the cooling plate defines an x-y plane; and
    wherein cold working the cooling plate includes cold stretching the cooling plate in an x-direction and/or a y-direction of the x-y plane but not transversely to the x-y plane.

2. The method according to claim 1, wherein following the joining of the flat component with the channel component, the cooling plate is stretched by approximately 0.1% to 10%.

3. The method according to claim 1, wherein following the joining of the flat component with the channel component, the cooling plate is stretched by approximately 1% to 3%.

4. The method according to claim 1, wherein cold stretching the cooling plate is performed in both the x-direction and the y-direction of the x-y plane.

5. The method according to claim 1, further comprising a further cold working of the cooling plate following the cold stretching.

6. The method according to claim 1, wherein the flat component and the channel component are soldered to one another at connection points located between grooves of the groove structure.

7. The method according to claim 6, wherein following the soldering of the flat component to the channel component and prior to the stretching, the cooling plate is cooled with a cooling rate of at least 15 K/min, in a temperature range 570-200° C.

8. The method according to claim 1, wherein at least one of the flat component and the channel component has a thickness d of 0.2 mm<d<2.0 mm.

9. The method according to claim 5, wherein the cooling plate is rolled for the further cold working.

10. The method according to claim 5, wherein the cooling plate is stamped for the further cold working.

11. The method according to claim 5, wherein the cooling plate is pressurized for the further cold working.

12. The method according to claim 6, wherein the flat component and the channel component are welded to one another.

13. The method according to claim 7, wherein after the flat component and the channel component are welded to one another, and prior to the stretching, the cooling plate is cooled with a cooling rate of approximately 15 K/min.

14. The method according to claim 7, wherein after the flat component and the channel component are soldered to one another, and prior to the stretching, the cooling plate is cooled with a cooling rate of approximately 40-100K/min.

15. The method according to claim 7, wherein after the flat component and the channel component are welded to one another, and prior to the stretching, the cooling plate is cooled with a cooling rate of approximately 40-100K/min.

16. A heat exchanger comprising:
a cooling plate produced according to the method of claim 1.

17. The method according to claim 1, including connecting the cooling plate to a battery of a vehicle.

18. The method according to claim 1, including conducting additional cold working operations to further increase the flatness of cooling plate, after the cooling plate is stretched.

19. The method according to claim 18, wherein the additional cold working operations include at least one of hammering, rolling, stamping, and pressurizing.

20. A vehicle, comprising:
a battery; and
a heat exchanger including a cooling plate produced according to the method of claim 1;
wherein the cooling plate is configured to cool the battery.

* * * * *